United States Patent
Connolly et al.

(10) Patent No.: US 6,403,394 B2
(45) Date of Patent: *Jun. 11, 2002

(54) REDUCED LEAKAGE TRENCH ISOLATION

(75) Inventors: Kevin M. Connolly; Jung S. Kang, both of Chandler, AZ (US); Berni W. Landau, Beaverton, OR (US); James E. Breisch, Chandler; Akira Kakizawa, Phoenix, both of AZ (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/821,561

(22) Filed: Mar. 29, 2001

Related U.S. Application Data

(62) Division of application No. 09/098,881, filed on Jun. 17, 1998, now Pat. No. 6,259,145.

(51) Int. Cl.[7] .............................................. H01L 21/329
(52) U.S. Cl. ............................................ 438/57; 438/73
(58) Field of Search ............................. 438/57, 91, 92, 438/414, 424, 425, 73, 75, 514, 527

(56) References Cited

U.S. PATENT DOCUMENTS

| | | | | |
|---|---|---|---|---|
| 5,566,044 A | * | 10/1996 | Bergmont et al. | 438/57 |
| 5,760,458 A | * | 6/1998 | Bergmont et al. | 438/57 |
| 5,970,316 A | * | 10/1999 | Merrill | 438/57 |
| 5,994,162 A | * | 11/1999 | Burghartz et al. | 438/57 |
| 6,080,601 A | * | 1/2000 | Bergmont et al. | 438/57 |
| 6,027,955 A | * | 2/2000 | Lee et al. | 438/57 |
| 6,027,956 A | * | 2/2000 | Irissou | 438/68 |
| 6,051,447 A | * | 4/2000 | Lee et al. | 438/57 |
| 6,265,241 B1 | * | 7/2001 | Pan | 438/57 |

* cited by examiner

*Primary Examiner*—Savitri Mulpuri
(74) *Attorney, Agent, or Firm*—Trop, Pruner & Hu, P.C.

(57) ABSTRACT

Leakage current may be reduced in trench isolated semiconductor devices by providing a buffer between the trench isolation and an active area For example, with a trench isolated photodiode, a buffer of opposite conductivity type may be provided between the trench and the diffusion that forms the p-n junction of the photodiode.

4 Claims, 2 Drawing Sheets

REDUCED LEAKAGE TRENCH ISOLATION

This is a divisional of prior application Ser. No. 09/098,881 filed Jun. 17, 1998 now U.S. Pat. No. 6,259,145.

BACKGROUND

This invention relates generally to semiconductor manufacturing processes and particularly to the use of trench isolation in connection with semiconductor manufacturing processes.

In a variety of semiconductor devices, trench isolation is utilized to electrically isolate active areas from one another. Trench isolation is used in modern semiconductor processes to manufacture a variety of devices including transistors and photodiodes.

Photodiodes used in an imaging array can be manufactured using conventional complementary metal oxide semiconductor (CMOS) processing. As a result, an imaging array can be produced on a semiconductor structure which also contains logic circuits such as microprocessors, memories and the like. A pixel sensor uses pixels formed by photodiodes which receive light information from an image and convert the light information to electrical signals that are transferred to subsequent circuitry for further processing. The image sensors may be active pixel sensors or passive pixel sensors.

CMOS image sensors have advantages over the conventional charge coupled device (CCD) image sensors because they may achieve lower power consumption, integration of on-chip logic and lower cost. However when the CMOS image sensors are integrated with other logic circuits such as microprocessors, the sensors may need to be made with processes which include silicidation and trench isolation. Covering the photodiode with silicide would effectively block the light that is incident on the photodiode and thereby prevent the device from operating. However the silicide can be prevented from covering the photodiode through the addition of one or two masking steps.

The trenches used for trench isolation are generally dry etched and, as a result, the trench surfaces usually have a large number of interface states. These interface states lead to high surface generation velocity and, as discovered by the present inventors, a large dark current. The trench forming processes also cause crystalline defects such as dislocations and stacking faults. Those crystalline defects reduce carrier generation lifetime which increases dark current. Dark current is a current which flows when no light is incident on the camera. This is an undesirable consequence of trench isolation. The dark current decreases signal-to-noise ratios for the image sensor and decreases image quality.

Thus there is a continuing need for image sensors which can be manufactured with advanced logic processes to enable the image sensors and the logic devices to be integrated in a single integrated circuit. There is also a more general need for techniques for overcoming leakage currents in trench isolated semiconductor devices.

SUMMARY

In accordance with one aspect, a semiconductor device includes a semiconductor structure with a trench formed in the structure. A diffusion of a first conductivity type is formed in the structure. A region of a second conductivity type, opposite to the first conductivity type, is formed between the trench and the diffusion.

DETAILED DESCRIPTION

Figure 1:
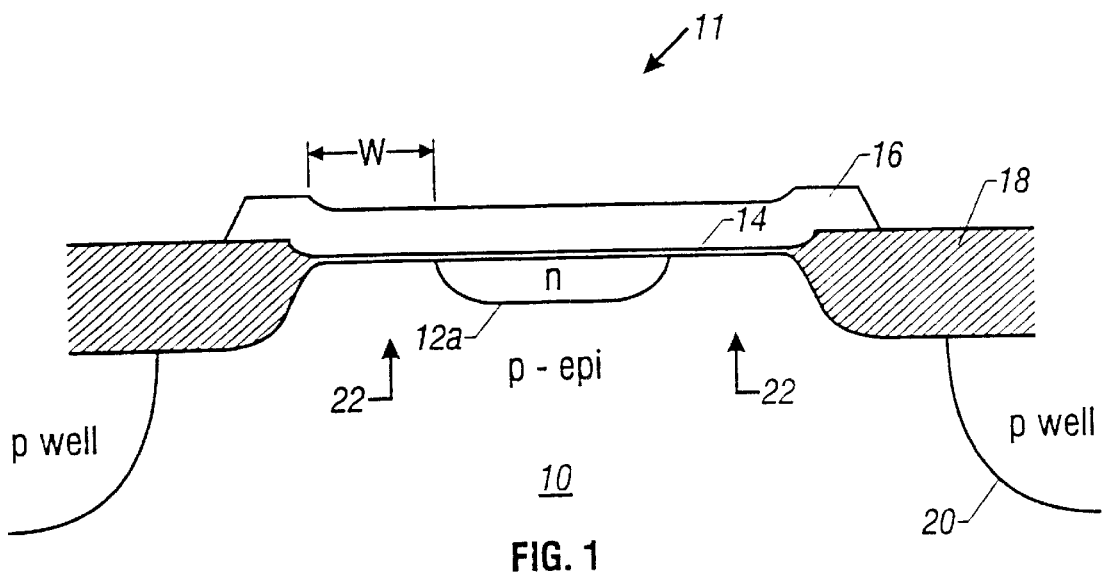
FIG. 1 is a greatly enlarged cross-sectional view of one embodiment of the present invention.

A semiconductor device 11 formed in a semiconductor structure 10, shown in FIG. 1, may include isolation trenches 18. Isolation trenches are generally formed by a dry etching process which can create interface states that lead to high surface generation velocity and dark current in photosensitive devices, such as photodiodes. The isolation trenches 18 are conventionally filled with an oxide or other filler material.

In the illustrated embodiment, a photodiode is formed that includes an n-type diffusion region 12a in a p-type epitaxial layer 10. Thus a depletion region is formed between the n-type region 12a and the p-type epitaxial layer 10.

A silicide-blocking layer 16, which could be silicon nitride, covers an active area between the trenches 18. Below the trench 18 is a p-well 20 in the illustrative p-type structure. An oxide layer 14, which may be called a pad oxide, may be formed between the layer 16 and the region 12a.

While the present invention is illustrated in connection with a photodiode in a p-type semiconductor structure, other conventional devices that have trench isolation, such as conventional transistors used in logic devices, could benefit from the present invention as well. Other trench isolated photosensitive device configurations can also be used. In addition, opposite conducting type devices could be used by simply inverting the conductivity types of the diffusion 12a illustrated in FIG. 1.

The n-type region 12a does not span the trenches 18 and is bounded on either side by p-type region 10. The p-type intervening regions 22 between the trenches 18 and the diffusion 12a act as buffer regions to reduce the leakage current caused by the interface states formed by the dry etched trench 18. This leakage current produces a dark current in trench isolated photosensitive devices. The width of the intervening regions 22 depends on the particular characteristics of the device in question. The width of the regions 22 may be adjusted to sufficiently reduce the leakage current to achieve desirable results.

Any conventional technique may be used to define the region 12a. In one conventional approach, the region 12a may be formed by the n-tip implant used in forming conventional transistor lightly doped drain structures. Thus prior to forming the layer 16, suitable masking layers may be provided to define an opening to receive the n-tip implant. Thereafter the implant may be activated and driven by a high temperature anneal step or other conventional activation techniques.

Thus the regions 22 in effect create a buffer around the n-type diffusion region 12a of the photodiode because they are formed between the layer 12a and the trench 18. This reduces leakage current arising from the depletion region which bounds the p-n junction. In the case of a photosensitive device reducing the leakage current reduces the dark current experienced by the resulting image sensor.

Figure 2:
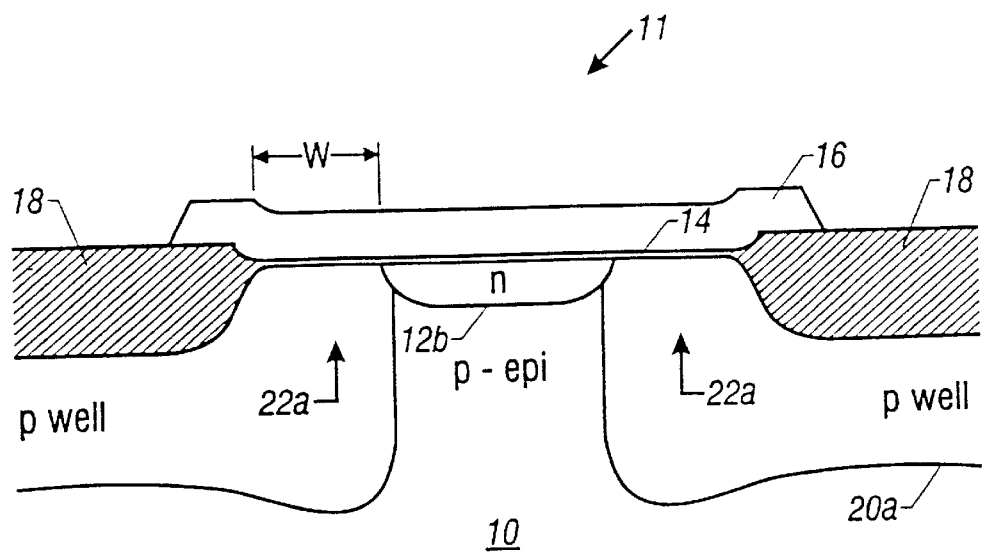
FIG. 2 is a greatly enlarged cross-sectional view of another embodiment of the present invention.

Another approach to overcoming the leakage created by the trench isolation process, shown in FIG. 2, uses the p-well regions 20a which extend into the region 22a between the n-type region 12b and the trench 18. Like the p-type regions 22 in the embodiment shown in FIG. 1, the incursion of the p-well into the regions 22a reduces leakage current between the depletion region and the interface states created in the trench 18.

The p-well may extend into the region 22a between the trench isolation and the diffusion 12b by suitable adjustments in the p-well masking process and/or by increasing the drive applied to the p-well implants. Other conventional techniques could be used as well. Essentially, the n-type diffusion region 12b could have spanned the region between the trench regions 18, but through the incursion of the p-well 20a, n-type material was converted in the regions 22a, to a p-type region to provide the buffering described above.

Figure 3:
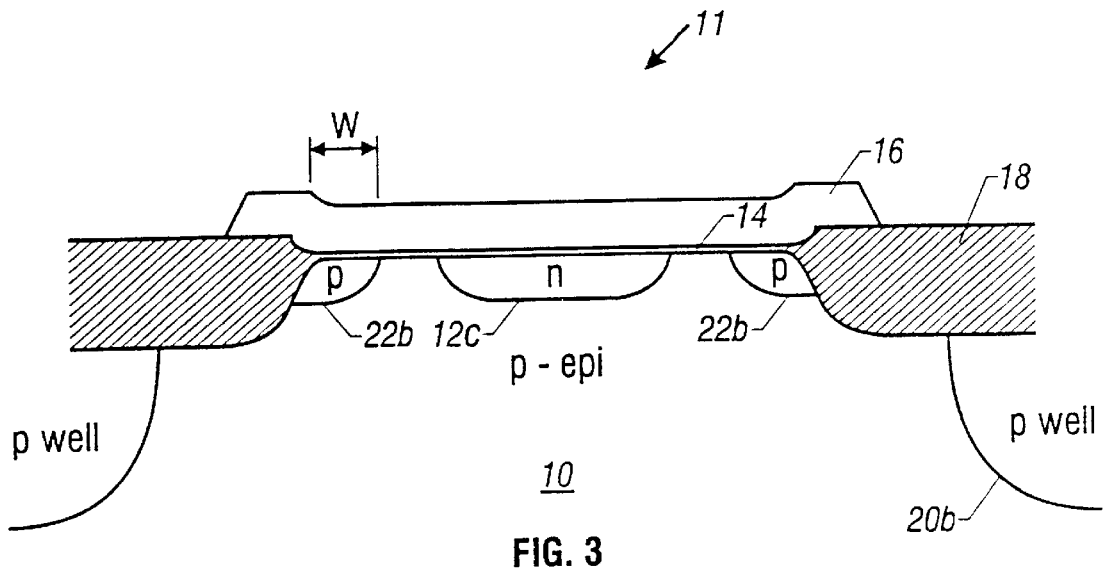
FIG. 3 is a greatly enlarged cross-sectional view of still another embodiment of the present invention.

Another approach to overcoming the leakage problem, shown in FIG. 3, is similar to the embodiments shown in FIGS. 1 and 2 but intervening p-type tip regions 22b are formed between the n-type diffusion 12c and the trenches 18. The diffusion 12c may be formed the same way as a region 12a in FIG. 1. However additional masking may be utilized to allow the p-type tip implant (also used, for example, to form the p-minus regions of a graded junction transistor) to be utilized to form p-minus or tip regions which extend into the region between the diffusion 12c and the trench 18. Again the regions 22b, like the regions 22a and 22 discussed previously, prevent leakage current between the depletion regions associated with the p-n junction and the trenches 18. It may also be desirable to cause the p-wells 20b to extend closer together to further isolate the depletion regions from the trenches 18.

The embodiments shown in FIGS. 1 through 3 are advantageous in that they have lower leakage current since the depletion regions are isolated from the trench. The buffer region 22 is still part of the active diode. Thus electrons optically generated in the buffer region diffuse into the p-n diode depletion region and contribute to the photo current. These diodes therefore do not suffer a reduction in quantum efficiency.

The width of the buffer region (W in the figures) is determined independently for each diode with particular attention being paid to the doping profiles. Thus W may be made up of the widest depletion region of the p-type side, the trench depletion region, the n-type lateral diffusion, the encroachment of the trench due to processing, and an allotment for misalignment. There is also a small depletion region around the trench due to dangling bond and other defects in the trench boundary.

Figure 4:
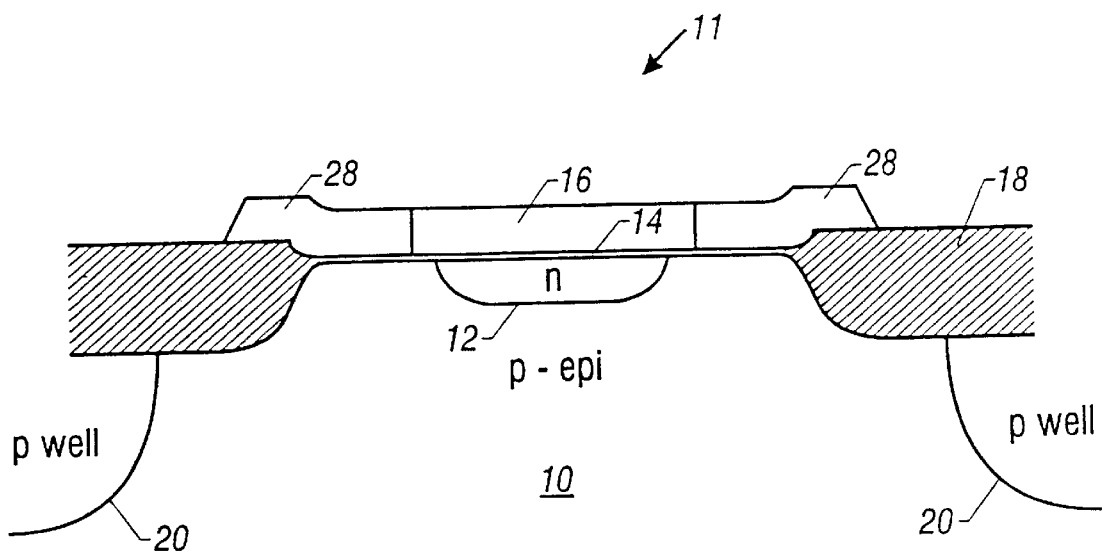
FIG. 4 is a greatly enlarged cross-sectional view of yet another embodiment of the present invention.

Referring now to FIG. 4, in another embodiment, the silicide is not blocked over the p-type region 10 forming a silicide portion 28. The portion 28 does not require a significant amount of area A microlens (not shown) could be used to focus a light into the center of the diode. The microlens may be formed as a deposited layer which forms a droplet shape that acts like a lens. In this case silicided portions 28 are formed on either side of the blocking layer 16.

While the present invention has been described with respect to a limited number of embodiments, those skilled in the art will appreciate numerous modifications and variations therefrom. For example, it is also possible to form the buffer region by diffusing a p-plus region into the area between the diffusion 12 and the trench 18. It is intended that the appended claims will cover all such modifications and variations as fall within the true spirit and scope of the present invention.

What is claimed is:

1. A method of forming a photosensitive device comprising:

forming a first region of a first conductivity type in a semiconductor structure of a second conductivity type opposite said first conductivity;

forming a trench in said structure;

forming a second region of a said second conductivity type between said trench and said first region as part of the photosensitive device; and forming a third region of the second conductivity type below the trench and laterally surrounding the first region.

2. The method of claim 1 including forming said second region by implanting conductivity type determining impurities at a position spaced from the trench.

3. The method of claim 1, including forming the second region as part of a p-well.

4. The method of claim 1, including forming the second region using the tip implant.

\* \* \* \* \*